(12) United States Patent
Sun (10) Patent No.: US 7,740,993 B2
(45) Date of Patent: Jun. 22, 2010

(54) MASK FOR SEQUENTIAL LATERAL SOLIDIFICATION (SLS) PROCESS AND A METHOD FOR CRYSTALLIZING AMORPHOUS SILICON BY USING THE SAME

(75) Inventor: Ming-Wei Sun, Jhubei (TW)

(73) Assignee: AU Optronics Corp., Hsinchu (TW)

( * ) Notice: Subject to any disclaimer, the term of this patent is extended or adjusted under 35 U.S.C. 154(b) by 829 days.

(21) Appl. No.: 11/453,931

(22) Filed: Jun. 16, 2006

(65) Prior Publication Data
US 2007/0015066 A1 Jan. 18, 2007

(30) Foreign Application Priority Data
Jul. 15, 2005 (TW) ............................... 94124035 A (51) Int. Cl.
*H01L 21/00* (2006.01)
(52) U.S. Cl. .............................. 430/5; 430/22; 438/166
(58) Field of Classification Search ................ 29/25.01; 430/5, 22; 438/151–166
See application file for complete search history.

(56) References Cited

U.S. PATENT DOCUMENTS

| 6,800,540 | B1 | 10/2004 | You | |
|---|---|---|---|---|
| 7,368,204 | B2 * | 5/2008 | You | ............................... 430/5 |
| 2004/0127066 | A1 | 7/2004 | Jung | |
| 2004/0253819 | A1 | 12/2004 | You | |
| 2005/0079693 | A1 | 4/2005 | Kang et al. | |

FOREIGN PATENT DOCUMENTS

| CN | 1586013 A | 2/2005 |
|---|---|---|
| CN | 1638023 A | 7/2005 |

* cited by examiner

*Primary Examiner*—Richard A. Booth
(74) *Attorney, Agent, or Firm*—Birch, Stewart, Kolasch & Birch, LLP (57) ABSTRACT

A mask for sequential lateral solidification (SLS) processes including at least one first window, one second window, one third window, and one fourth window is provided. Each window has a length extending longitude on the mask. The second window is aligned to the first window. The width of the first window is greater than that of the second window. The fourth window is aligned to the third window. The width of the third window is greater than that of the fourth window.

25 Claims, 8 Drawing Sheets

MASK FOR SEQUENTIAL LATERAL SOLIDIFICATION (SLS) PROCESS AND A METHOD FOR CRYSTALLIZING AMORPHOUS SILICON BY USING THE SAME

BACKGROUND OF THE INVENTION (1) Field of the Invention

This invention relates to a mask, more particularly relates to a mask for sequential lateral solidification (SLS) process.

(2) Description of the Prior Art

Liquid crystal displays (LCDs), with the advantages of slim size, low power consumption and radiation damage, has become a preferred choice in various displaying products including traditional CRT displays. For the same reason, LCDs have been widely used in various electronic devices such as desk top computers, personal digital assistants, note books, digital cameras, cell phones, and etc.

Figure 1:
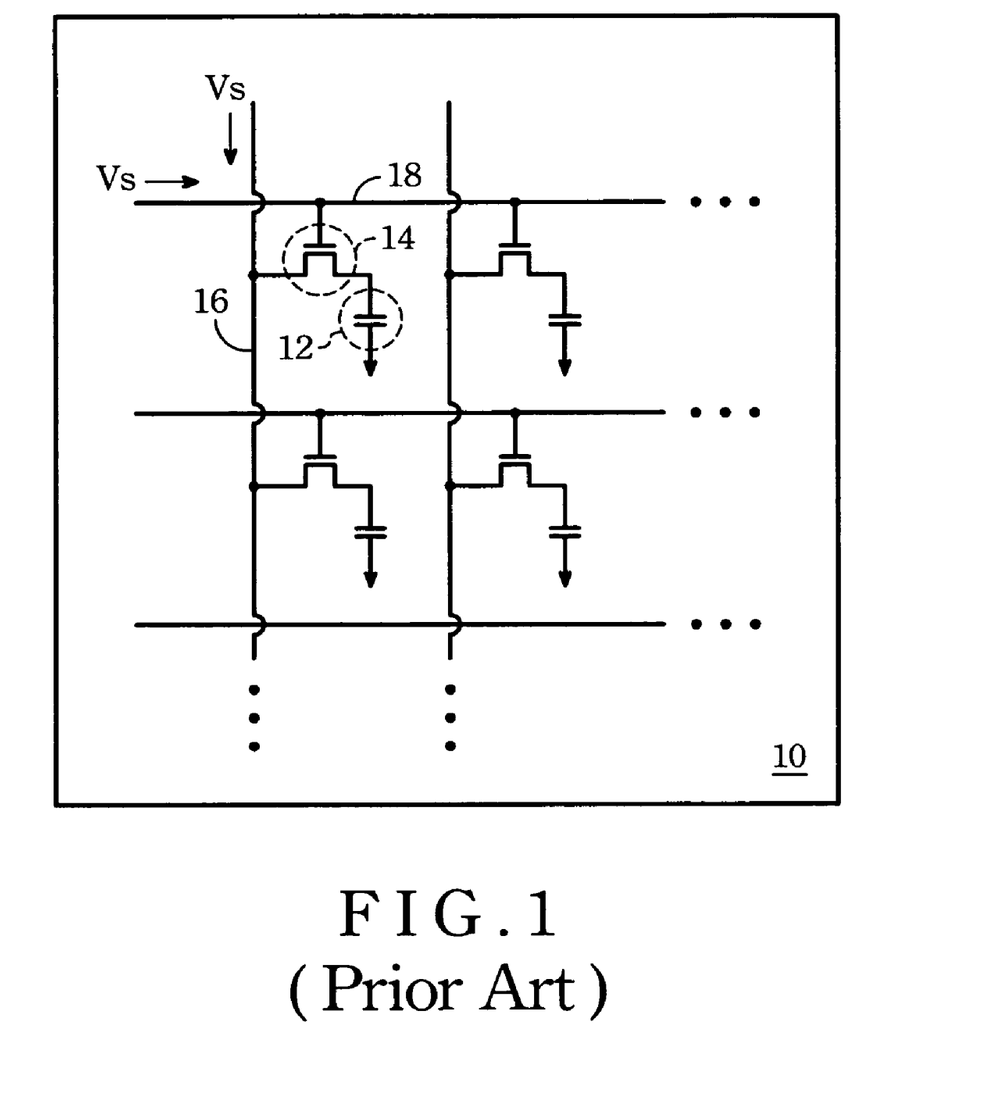
FIG. 1 is a schematic view of a typical active matrix liquid crystal display (AMLCD) panel.

FIG. 1 shows a typical active matrix liquid crystal display (AMLCD) panel 10 with a plurality of pixel devices 12 arrayed in matrix. Each pixel device 12 is connected with a thin film transistor (TFT) 14 operating as a switch for charging or discharging the pixel device 12. The source electrode of the TFT 14 is electrically connected with a source driver (not shown) through a signal line 16. The gate electrode of the TFT 14 is electrically connected to a scan driver (not shown) through a gate line 18. The displaying signal is transformed into source driving voltage (Vs) and gate driving voltage (Vg) applied to the source electrode and gate electrode respectively to generate images.

Due to the temperature limit for the glass substrate, in the traditional manner, the TFTs 14 formed on the LCD panel 10 must be amorphous silicon TFTs. However, the switching speed, the electric characters, and the reliability of the amorphous silicon TFTs are not qualified as being applied in the drivers for controlling the display of the pixel devices 12. Instead, polysilicon TFTs are suggested to be applied in the drivers to achieve a high operation speed. Therefore, the drivers must be formed on the silicon chips and connected to the LCD panel 10 through some pipelines.

There are two reasons why polysilicon TFTs fabricated on the glass substrate are demanded in present. First, the pixel devices need a higher switching speed for a larger LCD panel. Second, the drivers must be formed on the glass substrate for a slimmer display panel. Therefore, the demand of forming high quality polysilicon layers on the glass substrate has become urgent.

Figure 2:
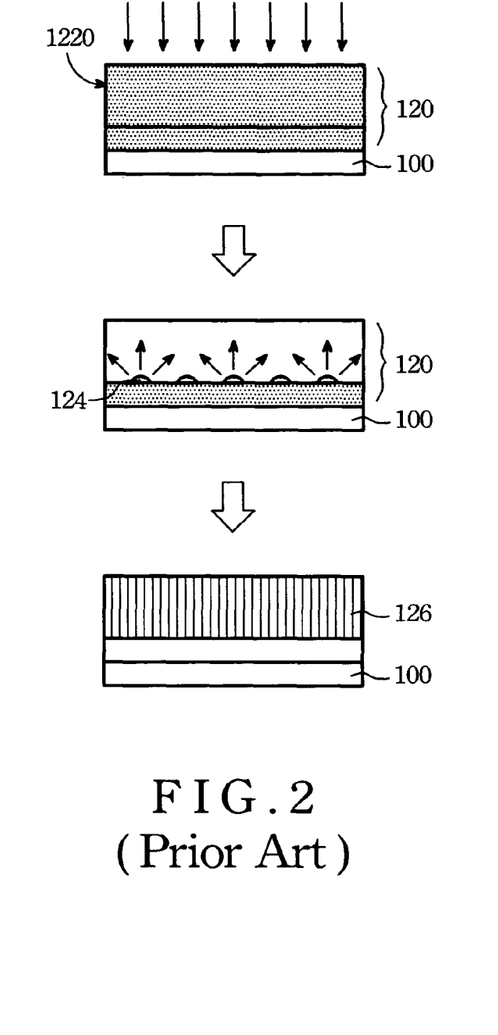
FIG. 2 depicts a typical low temperature polysilicon (LTPS) fabrication process.

FIG. 2 shows a traditional low temperature polysilicon (LTPS) fabrication process. First, an amorphous silicon layer 120 is formed atop a substrate 100, and then laser illumination is utilized to form a melted layer 122 near the top surface of the amorphous silicon layer 120. The amorphous silicon material right under the melted layer 122 is utilized as seeds for growing upward to create grains 126. Due to the limitation of the thickness of the melted layer 122, the grain size is usually less than 1 micron. Thus, the promotion of the electric ability of the resultant TFTs is limited.

Figure 3:
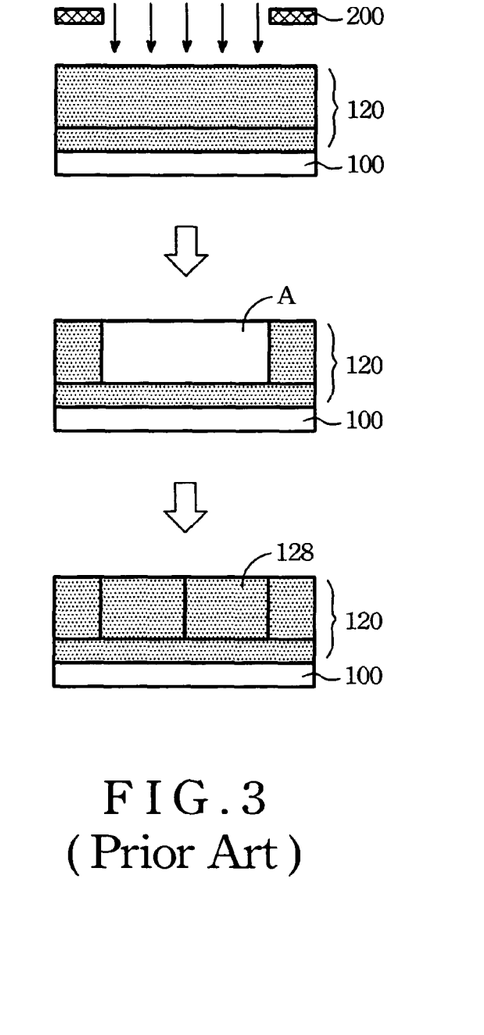
FIG. 3 depicts a typical lateral solidification process.

In order to access larger grain size, as shown in FIG. 3, the lateral solidification process is developed by using laser illumination to melt a predetermined region A within the amorphous layer 120 through a mask 200. Since a lateral temperature gradient is generated in the region A, the amorphous silicon material close to the edge of the melting region A is utilized as seeds for growing toward the center of the melting region A to generate grains 128 with larger size.

Figure 4:
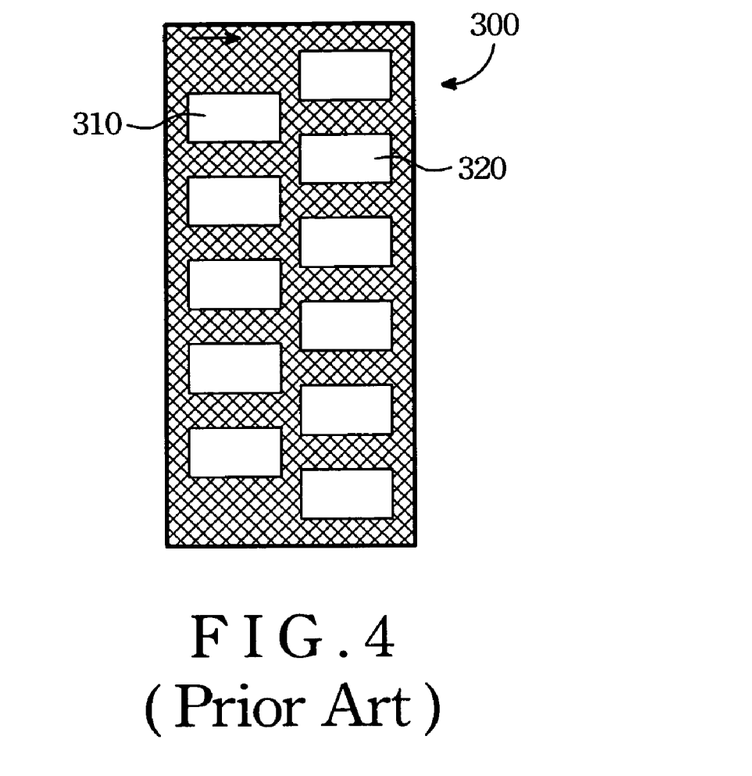
FIG. 4 shows a typical mask utilized in sequential lateral solidification (SLS) processes.

As shown in FIG. 4, which shows a typical mask 300 utilized in the sequential lateral solidification (SLS) process. As shown, the mask 300 has a plurality of first rectangular windows 310 lined in row on the mask, and a plurality of second rectangular windows 320 lined in row on the mask. Each first rectangular window 310 is aligned to the shielded region between neighboring two second rectangular windows 320.

Figure 5:
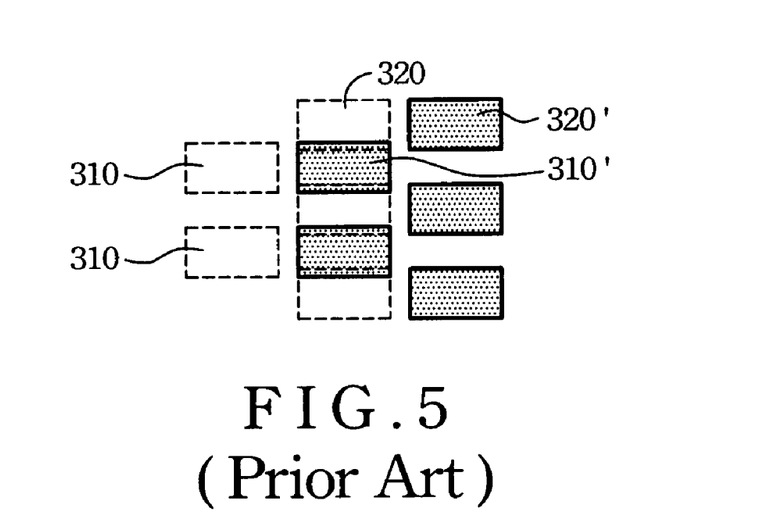
FIG. 5 depicts a typical SLS process.
Figure 6A:
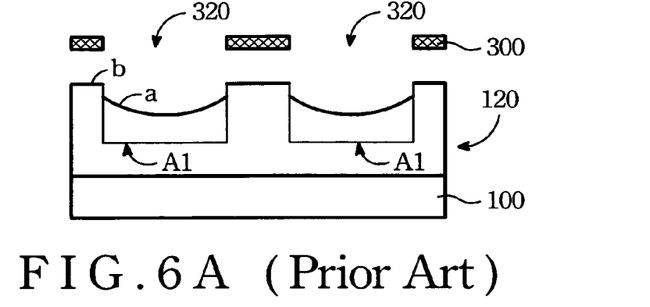
FIGS. 6A to 6D are a sequence of cross section views depicting a traditional SLS process.
Figure 6B:
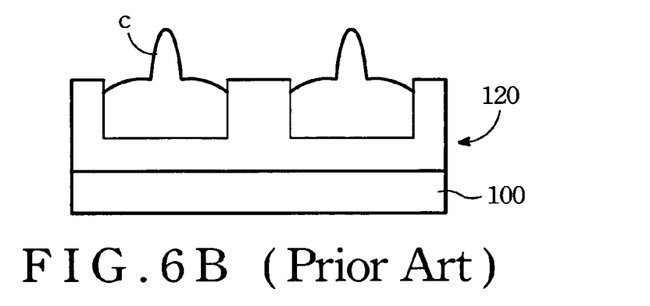

FIG. 5 depicts the SLS process using the mask 300 of FIG. 4. In the first illumination step, laser illumination melts the amorphous silicon layer through the first windows 310 and the second windows 320 on the mask 300. Since the density of silicon in liquid state, 2.53 g/cm$^3$, is greater than in solid state, 2.33 g/cm$^3$, the top surface a of the melted region of the amorphous silicon layer is located below the top surface b of the unmelted region as shown in FIG. 6A. In addition, since the silicon grains are grown along the temperature gradient, that is from the both edges of the melted region A1 toward the center thereof, as shown in FIG. 6B, a protrusion c must be formed at the center of the melted region A1 after the crystallization.

Figure 6C:
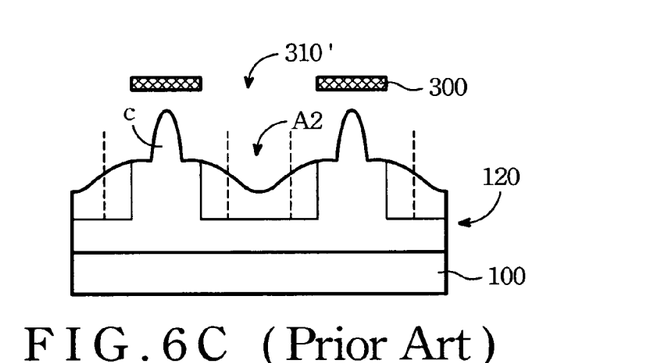

In the second illumination step, as shown in FIG. 5, the mask 300 is moved rightward with a distance substantially identical to the length of the second window 320 to have the first window 310' focusing on the unmelted region between the melted regions A1 in the first illumination step. Also referring to FIG. 6C, in the present illumination step, the portion of the amorphous silicon layer (the melted regions A1 of FIG. 6A) with respect to the second windows 320 is shielded by the mask 300, the portion of the amorphous silicon layer A2 shielded by the mask 300 in the first illumination step is melted. Since the density of silicon in liquid state is greater than in solid state, some valley-like portion d must be formed close to the edges of the melted region A2, and a protrusion c is formed at the center of the second region A2.

The protrusion c atop the resultant polysilicon layer may affect the coverage of the dielectric layer in the following steps to induce abnormal increasing of leakage current and even the breakthrough of the dielectric layer. In order to reduce the height of the protrusion c, a typical method is to re-flow the polysilicon layer by laser illuminating the polysilicon layer as a whole. However, the valley-like portion d is also melted by using this method and the probability of agglomeration to break the polysilicon layer increases.

Accordingly, a mask utilized in sequential lateral solidification (SLS) processes is provided in the present invention to flatten the protrusion and to prevent the breakage of the resultant polysilicon layer.

SUMMARY OF THE INVENTION

It is a main object of the present invention to flatten the protrusion on the polysilicon layer, which is formed due to traditional SLS process, so as to promote the coverage for the following fabrication steps.

A mask utilized in sequential lateral solidification (SLS) processes to form a polysilicon layer on an amorphous silicon layer is provided in the present invention. The mask has at least one first window, one second window, one third window, and one fourth window. Each window has a length extending along a first direction. The second window is aligned to the first window and has a width smaller than that of the first window. The fourth window is aligned to the third window and has a width greater than that of the third window.

In an embodiment of the present invention, the third window is located adjacent to the length of the first window.

In another embodiment of the present invention, the third window is located adjacent to the length of the second window.

A method for forming a polysilicon layer in an amorphous silicon layer is also provided in the present invention. The method comprises the steps of: (a) providing a substrate; (b) forming an amorphous silicon layer on the substrate; (c) providing a mask as mentioned above; (d) applying a laser and the mask on the substrate to crystallize the amorphous silicon layer to form a plurality of first crystallizing regions corresponding to the first window and the fourth window; (e) moving the mask or the substrate along the first direction to have the second window and the third window focusing on a central protrusion formed in the first crystallizing regions; and (f) melting the amorphous silicon layer through the mask to lower down the central protrusion and to crystallize the amorphous silicon layer to form a plurality of second crystallizing regions corresponding to the first window and the fourth window, respectively.

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 7A:
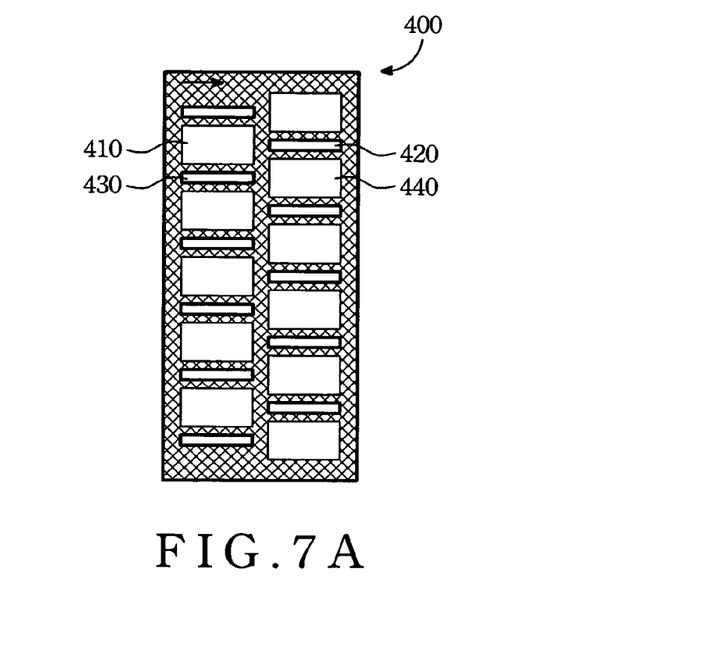
FIG. 7A is a top view showing a preferred embodiment of a mask utilized in an sequential lateral solidification (SLS) process in accordance with the present invention.

FIG. 7A is a top view showing a preferred embodiment of a mask 400 applied in the SLS process in accordance with the present invention. As shown, the mask 400 has at least one first window 410, one second window 420, one third window 430, and one fourth window 440. Each of the windows 410, 420, 430, 440 is extended along a first direction (which may be defined as the lateral direction of the mask).

The first windows 410 are lined along a second direction (which may be defined as the longitude direction of the mask 400). The second windows 420 are lined along the second direction on the mask 400, and each second window 420 is aligned to a respected first windows 410. The third windows 430 are lined along the second direction on the mask 400. The fourth windows 440 are lined along the second direction on the mask 400, and each fourth window 440 is aligned to a respected third windows 430. Each third window 430 is located adjacent to the length of a respected first window 410 and between neighboring first windows 410. Each second window 420 is located adjacent to the length of a respected fourth window 440 and between neighboring fourth windows 440.

Figure 7B:
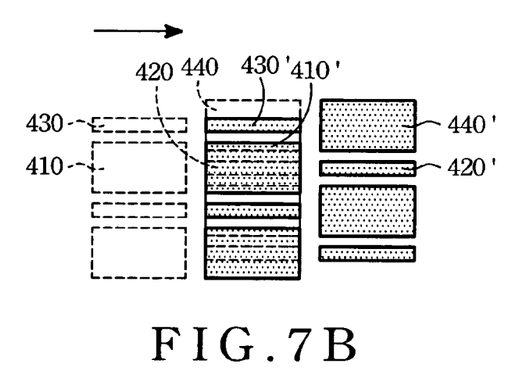
FIG. 7B depicts an SLS process using the mask of FIG. 7A.
Figure 8A:
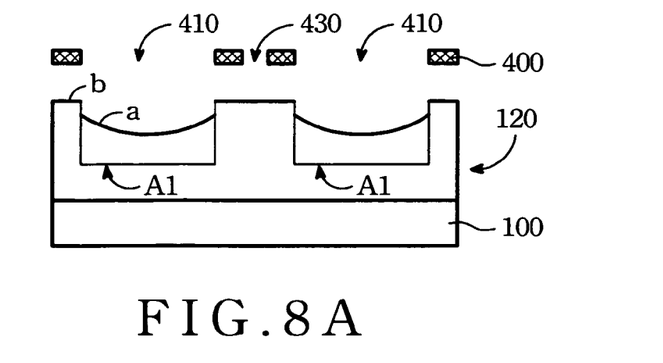
FIGS. 8A to 8C are a sequence of cross section views depicting the SLS process in accordance with the present invention.
Figure 8B:
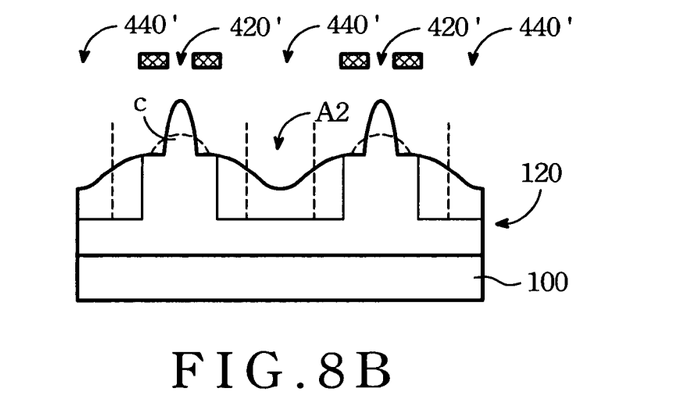
Figure 8C:
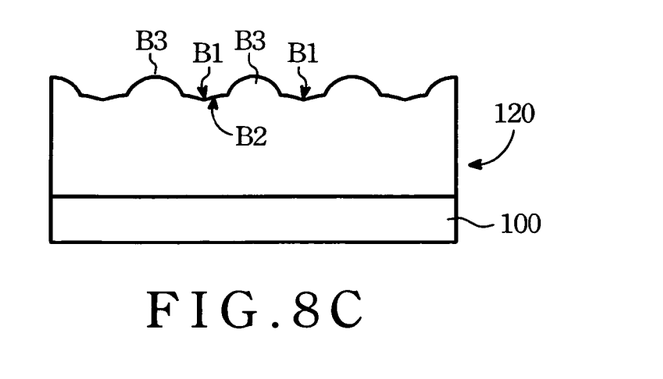

FIGS. 8A to 8C depict an SLS process in accordance with the present invention using the mask 400 of FIG. 7A. In the beginning, a substrate 100 is provided with an amorphous silicon layer 120 formed thereon. Afterward, as shown in FIG. 8A, the mask 400 of FIG. 7A is utilized to focus on the substrate 100. Than, laser illumination is applied through the mask 400 to melt the amorphous silicon layer 120. The melted portions within the amorphous silicon layer 120 are then crystallized to form a plurality of first crystallizing regions A1 with respect to the first windows 410 and the fourth windows 440 (referring to the dash line of FIG. 7B).

Afterward, as shown in FIG. 8B, moving the mask 400 or the substrate 100 along the first direction to have the second window 420 and the third window 430 of the mask 400 focusing on the central protrusion c in the first crystallizing regions A1 (referring to the solid line of FIG. 7B). Then, laser illumination is applied through the mask 400 to melt the amorphous silicon layer 120. The melted portions are then crystallized to form a plurality of second crystallizing regions A2 in the amorphous silicon layer 120 with respect to the first windows 120 and the fourth windows 440. In addition, as shown in FIG. 8C, the central protrusions c of the first crystallizing regions A1, which are labeled B3 in this figure, are melted in the present laser illumination step. After the sequential movement of the mask 400 or the substrate 100 along the first direction, referring to FIG. 7C, a polysilicon layer as a whole is formed over the amorphous silicon layer 120.

As shown in FIG. 8B, in order to prevent the surroundings of the central protrusion c within the first crystallizing regions A1 being melted and deformed, the first window 410 must have a width at least greater than that of the second window 420 and the fourth window 440 must have a width at least greater than that of the third window 430. In addition, as a preferred embodiment, the first window 410 may have a width greater than five times the width of the second window 420, and the fourth window 440 may have a width greater than five times the width of the third window 430.

In order to promote the uniformity of the crystallized grains, the first window 410 should have a dimension identical to that of the fourth window 440 and the second window 420 should have a dimension identical to that of the third window 430. In addition, the center of the second window 420 should be aligned to the center of the first window 410 and the center of the third window 430 should be aligned to the center of the fourth window 440 so as to make sure that the second window 420 and the third window 430 may precisely focus on the central protrusion c within the first crystallizing regions A1. Moreover, the width of the fourth window 440 must be greater than the interval between neighboring first windows 410 and the width of the first window 410 must be greater than the interval between neighboring fourth windows 440 to make sure no amorphous area on the amorphous silicon layer 120 remained.

Figure 10A:
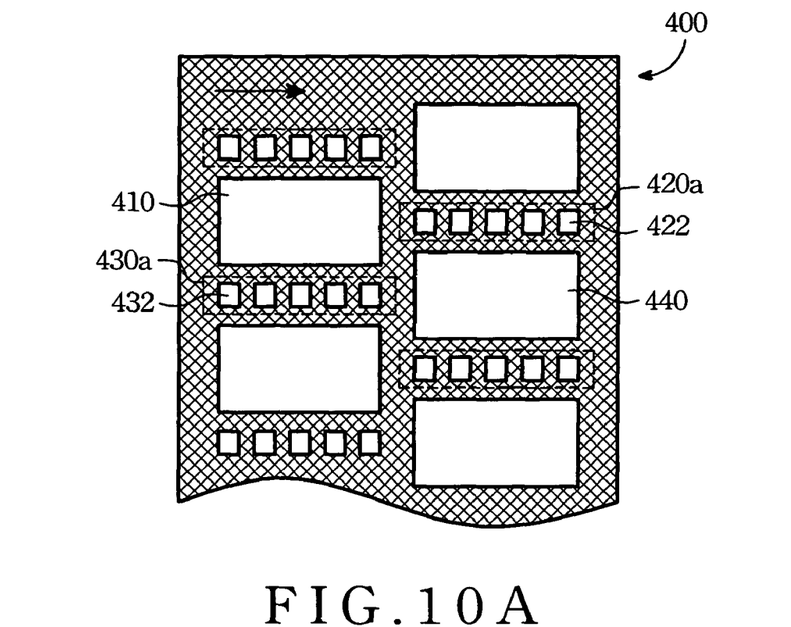
FIG. 10A is a schematic view depicting a preferred embodiment of the second window in accordance with the present invention.
Figure 10B:
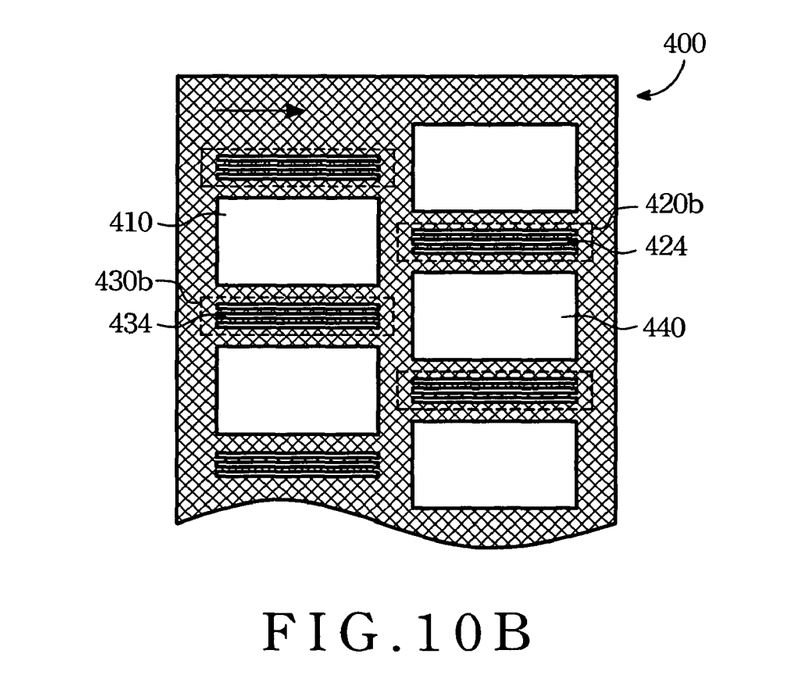
FIG. 10B is a schematic view depicting another preferred embodiment of the second window in accordance with the present invention.

In order to reduce the optical energy illuminated through the second window 420 or the third window 430 to prevent the planar portions B1, B2 surrounding the central protrusion c being melted, as shown in FIG. 10A, the second window 420$a$ in accordance with the present invention may be composed of a plurality of transmission regions 422 arranged lengthwise. The laser beams penetrating these transmission regions 422 is combined to form an illumination corresponding to the case as shown in FIG. 7A due to optical interference but a smaller total optical energy. Therefore, the irradiance (which is understood as the average energy per unit area per time) passing through the second window 420$a$ illuminated on the amorphous layer in the present embodiment is smaller than the irradiance passing through the first window 410 illuminated on the amorphous layer. In addition, as shown in FIG. 10B, the second window 420$b$ may be composed of a plurality of transmission regions 424 arranged widthwise. The irradiance passing through the second window 420$b$ illuminated on the amorphous layer is smaller than the irradiance passing through the first window 410 illuminated on the amorphous layer. The embodiments as shown in FIGS. 10A and 10B may be also applied to the third window 430$a$ and 430$b$ of the mask in accordance with the present invention.

Basically, the pattern on the mask is projected on the amorphous layer with a predetermined transverse magnification x. Since the grain length is a little greater than half the width of the first crystallizing area A1 as described in FIG. 8C, it is understood that the width of the first window 410 or the fourth window 440 must be at least twice the length L of the grains to be formed divided by the transverse magnification x. In detail, the length L of the grains is approximately identical to the sum of half the width of the first window 410 (or the fourth window 440) and half the interval between neighboring first windows 410 (or the neighboring fourth windows 440), multiplied by the transverse magnification x.

Figure 9A:
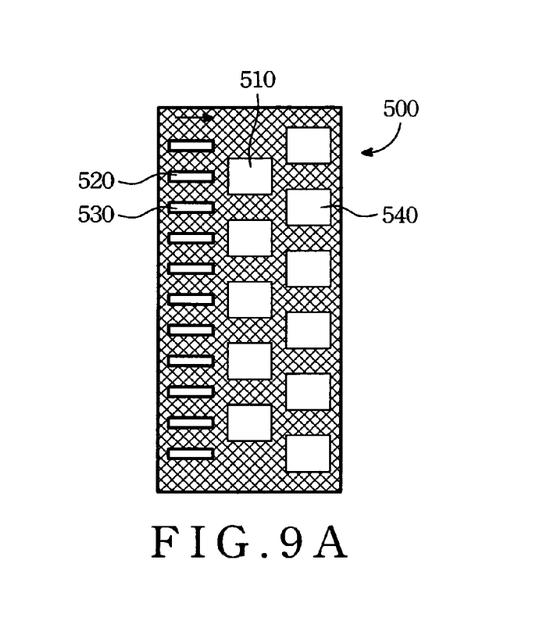
FIG. 9A is a top view showing another preferred embodiment of a mask utilized in sequential lateral solidification (SLS) process in accordance with the present invention.

FIG. 9A shows a top view of another preferred embodiment of the mask 500 utilized in the SLS process in accordance with the present invention. In contrast with the mask 400 shown in FIG. 7A, a second window 520 of the mask 500 is located at the left side of the first window 510, a third window 530 located at the left side of the fourth window 540, and the third window 530 is located adjacent to the length of the second window 520.

Figure 9B:
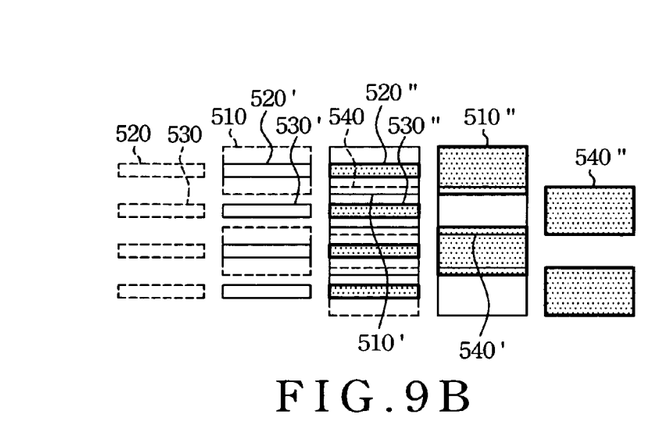
FIG. 9B depicts an SLS process using the mask of FIG. 9A.
Figure 9C:
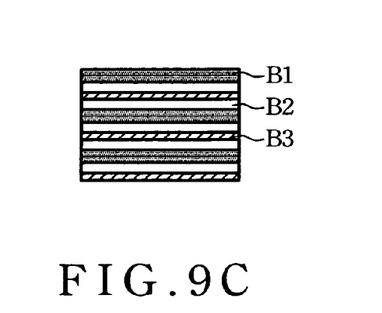
FIG. 9C shows a schematic view of the resultant polysilicon structure formed in the amorphous layer using the mask of FIG. 9A.

FIG. 9B describes the SLS process using the mask 500 provided in FIG. 9A. FIG. 9C describes the resultant polysilicon layer formed on the amorphous silicon layer. In compared with the SLS process shown in FIGS. 8A to 8C, which characterized with two repeated melting steps (corresponding to the dash line portion and the solid line portion in FIG. 7B respectively), the present embodiment is characterized with three repeated melting steps (corresponding to the dash line portion, the solid line portion, and the filled portion in FIG. 9B respectively). In the first step, a plurality of first crystallizing regions is formed by laser illuminating through the first windows 510 and the fourth windows 540. In the second step, the central protrusions within the first crystallizing regions corresponding to the first windows 510 are melted by laser illuminating through the second windows 520'. Until the third step, the central protrusions within the first crystallizing regions corresponding to the fourth windows 540 are melted by laser illuminating through the third windows 530".

Figure 7C:
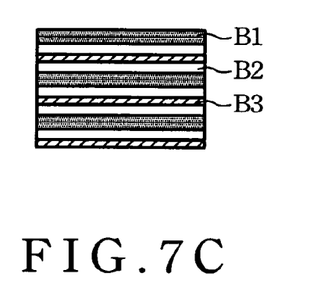
FIG. 7C shows a schematic view of the resultant polysilicon structure formed in the amorphous layer using the mask of FIG. 7A.

It should be noted although the mask 400 of FIG. 7A and the mask 500 of FIG. 9A have different patterns, no significant distinction exists in the resultant polysilicon layer structures as show in FIG. 7C and FIG. 9C.

Figure 6D:
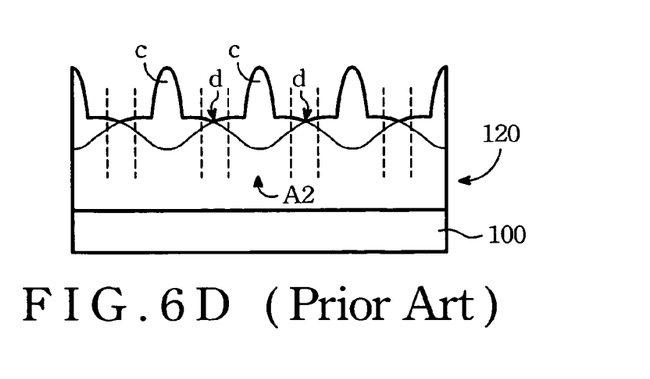

As shown in FIG. 6D, the polysilicon layer formed by using traditional SLS process has distinct protrusions c on the surface thereof. The protrusions c may damage the coverage of the dielectric layer deposited in the following steps to increase leaky current or even result the breakthrough of the dielectric layer. In contrast, the protrusions c on the polysilicon layer can be locally flattened in the SLS process together with the mask 400 provided in the present invention as shown in FIGS. 8B and 8C. Thus, the problem of coverage maybe resolved.

In addition, in order to lower down the protrusion c, the traditional method illuminates the top surface of the polysilicon layer as a whole to re-flow the polysilicon layer. However, this method has a drawback that the valley-like portion d in the polysilicon layer is also melted to result agglomeration event or even break the polysilicon layer. In contrast, the mask provided in the present invention have the laser illumination focusing on the protrusions c to prevent the valley-like portion d being melted. Thus, the problem encountered in the traditional method can be prevented.

While the embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

I claim:

1. A mask utilized in sequential lateral solidification (SLS) processes to form a polysilicon layer on an amorphous silicon layer, comprising:
   at least one first window having a length extending along a first direction, wherein the width of the first window is twice a predetermined value, wherein the predetermined value is a desired grain length of the polysilicon layer divided by a transverse magnification with which the mask is projected on the amorphous silicon layer;
   at least one second window having a length extending along the first direction and aligned to the first window with a width smaller than that of the first window;
   at least one third window having a length extending along the first direction; and
   at least one fourth window having a length extending along the first direction and aligned to the third window with a width greater than that of the third window, wherein each of the windows is spaced apart from each other by an intervening non-window portion, and each of the windows does not have any intervening non-window portions.

2. The mask of claim 1, wherein the at least one third window is located adjacent to the length of the at least one first window.

3. The mask of claim 1, wherein the at least one third window is located adjacent to the length of the at least one second window.

4. The mask of claim 1, wherein the at least one third window is located between two neighboring first windows.

5. The mask of claim 1, wherein the width of the at least one fourth window is greater than an interval of the first windows.

6. The mask of claim 1, wherein the width of the at least one first window is greater than an interval of the fourth windows.

7. The mask of claim 1, wherein the at least one second window has a center aligned to that of the first window.

8. The mask of claim 1, wherein the at least one third window has a center aligned to that of the fourth window.

9. The mask of claim 1, wherein the at least one first window has a dimension substantially identical to that of the fourth window.

10. The mask of claim 1, wherein at least one the second window has a dimension substantially identical to that of the third window.

11. The mask of claim 1, wherein the width of the at least one first window is at least five times the width of the at least one second window.

12. The mask of claim 1, wherein the width of the at least one fourth window is at least five times the width of the at least one third window.

13. The mask of claim 1, wherein the width of the at least one fourth window is substantially identical to twice a grain length of the polysilicon layer divided by a transverse magnification with which the mask being projected on the amorphous silicon layer.

14. The mask of claim 1, wherein the at least one second window is composed of a plurality of transmission regions arranged lengthwise to have a radiance smaller than that of the first window.

15. The mask of claim 1, wherein the at least one third window is composed of a plurality of transmission regions arranged widthwise to have a radiance smaller than that of the fourth window.

16. A method for forming a polysilicon layer in an amorphous silicon layer, comprising:

providing a substrate;

forming an amorphous silicon layer on the substrate;

providing the mask of claim 1;

applying a laser and the mask on the substrate to crystallize the amorphous silicon layer and form a plurality of first crystallizing regions corresponding to the first window and the fourth window;

moving the mask or the substrate along the first direction to have the second window and the third window focusing on a central protrusion formed in the first crystallizing regions; and melting the amorphous silicon layer through the mask to lower down the central protrusion and to crystallize the amorphous silicon layer to form a plurality of second crystallizing regions corresponding to the first window and the fourth window, respectively.

17. The method of claim 16, wherein moving the mask or the substrate along the first direction comprises moving the mask or the substrate along the first direction with a distance substantially identical to the length of the first window.

18. The method of claim 16, wherein the first crystallizing regions are overlapped with the second crystallizing regions.

19. The method of claim 16, wherein the second window has a center aligned to that of the first window.

20. The method of claim 16, wherein the third window has a center aligned to that of the fourth window.

21. The method of claim 16, wherein the first window has a dimension substantially identical to that of the fourth window.

22. The method of claim 16, wherein the second window has a dimension substantially identical to that of the third window.

23. The method of claim 16, wherein the width of the first window is at least five times the width of the second window.

24. The method of claim 16, wherein the width of the fourth window is at least five times the width of the third window.

25. The method of claim 16, wherein the width of the fourth window is substantially identical to twice a grain length of the polysilicon layer divided by a transverse magnification with which the mask being projected on the amorphous silicon layer.

* * * * *